US008716691B2

(12) United States Patent
Oshino

(10) Patent No.: US 8,716,691 B2
(45) Date of Patent: May 6, 2014

(54) NONVOLATILE MEMORY DEVICE AND METHOD FOR MANUFACTURING THE SAME

(75) Inventor: Shigeto Oshino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 376 days.

(21) Appl. No.: 12/973,183

(22) Filed: Dec. 20, 2010

(65) Prior Publication Data

US 2012/0012803 A1 Jan. 19, 2012

(30) Foreign Application Priority Data

Jul. 14, 2010 (JP) ................................ 2010-159415

(51) Int. Cl.
*H01L 45/00* (2006.01)
(52) U.S. Cl.
USPC ................ 257/4; 257/2; 257/5; 257/E45.001; 365/148; 977/742
(58) Field of Classification Search
USPC ....................... 257/2, 4, 5, E45.001, E45.002; 365/148; 977/742
See application file for complete search history.

(56) References Cited

U.S. PATENT DOCUMENTS

| 6,064,118 | A | 5/2000 | Sasaki | |
| 8,183,121 | B2* | 5/2012 | Schricker et al. | 438/381 |
| 2009/0251940 | A1 | 10/2009 | Ito | |
| 2010/0276656 | A1* | 11/2010 | Sinha et al. | 257/3 |
| 2011/0163290 | A1* | 7/2011 | Rueckes et al. | 257/9 |
| 2011/0260290 | A1* | 10/2011 | Kalra et al. | 257/538 |

FOREIGN PATENT DOCUMENTS

| JP | 2004-179229 A | 6/2004 |
| JP | 2007-067374 A | 3/2007 |
| JP | 2009-4641 | 1/2009 |
| JP | 2009-43942 | 2/2009 |
| JP | 2009-252974 A | 10/2009 |
| JP | 2010-123646 A | 6/2010 |
| WO | WO 2009/031336 A1 | 3/2009 |
| WO | WO 2009/137222 A2 | 11/2009 |

OTHER PUBLICATIONS

U.S. Appl. No. 13/052,426, filed Mar. 21, 2011, Aoyama, et al.
U.S. Appl. No. 13/235,842, filed Sep. 19, 2011, Oshino, et al.
U.S. Appl. No. 13/018,765, filed Feb. 1, 2011, Aoyama, et al.
Office Action issued Dec. 4, 2013 in Japanese Patent Application No. 2010-159415 filed Jul. 14, 2010 (with English Translation).

\* cited by examiner

*Primary Examiner* — Calvin Lee
*Assistant Examiner* — Scott Stowe
(74) *Attorney, Agent, or Firm* — Oblon, Spivak, McClelland, Maier & Neustadt, L.L.P.

(57) ABSTRACT

According to one embodiment, a nonvolatile memory device includes a lower electrode layer, a nanomaterial assembly layer, and an upper electrode layer. The nanomaterial assembly layer is provided on the lower electrode layer and includes a plurality of micro conductive bodies assembled via a gap. The upper electrode layer is provided on the nanomaterial assembly layer. The portion of the micro conductive bodies is buried at least in a lower part of the upper electrode layer.

4 Claims, 19 Drawing Sheets

VERTICAL DIRECTION

WORD LINE DIRECTION

NONVOLATILE MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2010-159415, filed on Jul. 14, 2010; the entire contents of which are incorporated herein by reference.

FIELD

Embodiments described herein relate generally to a nonvolatile memory device and a method for manufacturing the same.

BACKGROUND

It has recently been discovered that a specific metal oxide material under application of a voltage exhibits two states, i.e., low resistance state and high resistance state, depending on the resistivity before the voltage application and on the magnitude of the applied voltage. A novel nonvolatile memory device based on this phenomenon is drawing attention. This nonvolatile memory device is called ReRAM (resistance random access memory). As an actual device structure for the ReRAM, from the viewpoint of increasing the integration density, a three-dimensional cross-point structure is proposed. In this structure, a memory cell is located at each cross-point between the word line (WL) and the bit line (BL). Even in ReRAM, further increase of integration density is required.

DETAILED DESCRIPTION

Figure 1:
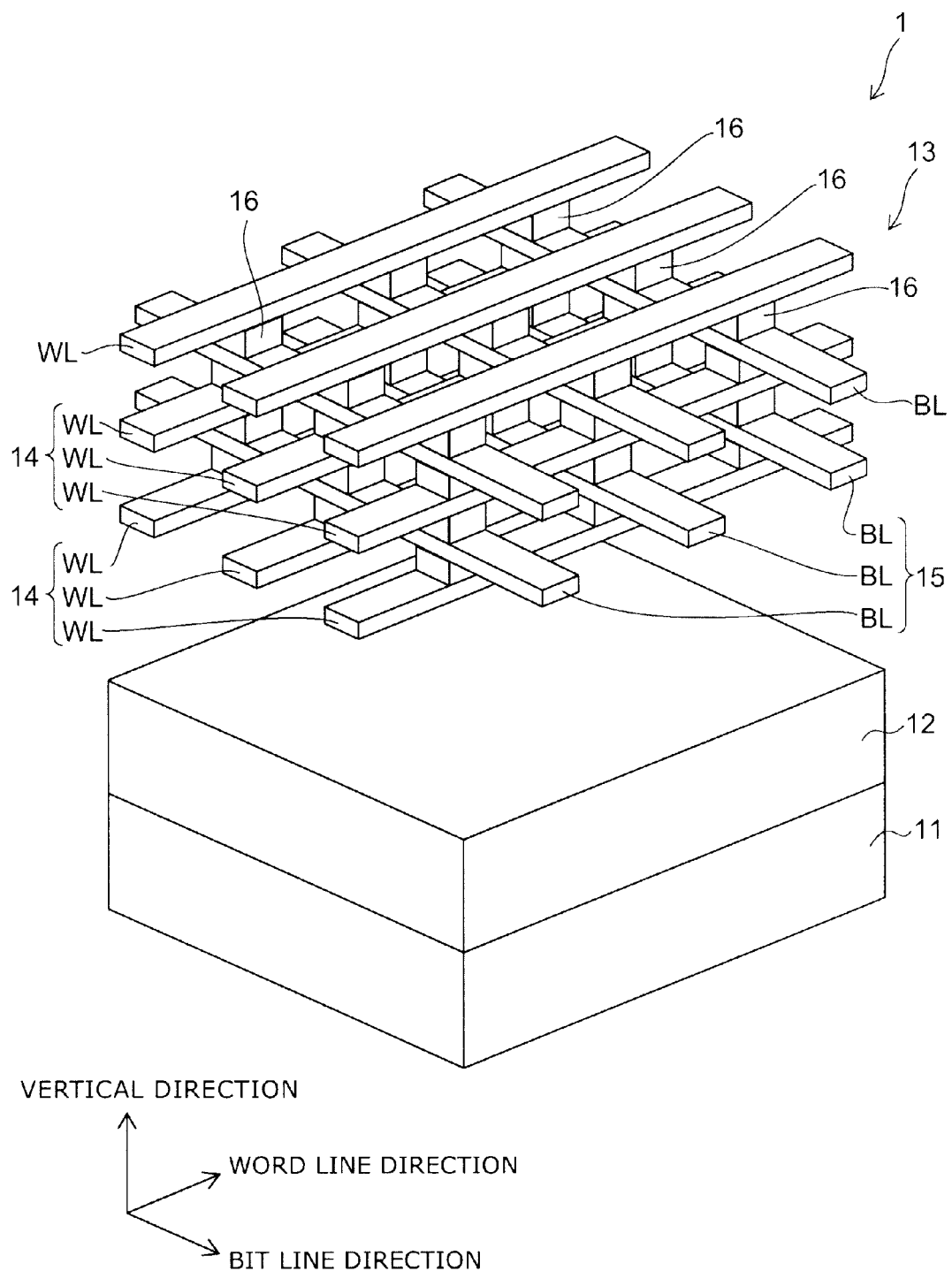
FIG. 1 is a perspective view illustrating a nonvolatile memory device according to a first embodiment.

In general, according to one embodiment, a nonvolatile memory device includes a lower electrode layer, a nanomaterial assembly layer, and an upper electrode layer. The nanomaterial assembly layer is provided on the lower electrode layer and includes a plurality of micro conductive bodies assembled via a gap. The upper electrode layer is provided on the nanomaterial assembly layer. The portion of the micro conductive bodies is buried at least in a lower part of the upper electrode layer.

In general, according to one embodiment, a method for manufacturing a nonvolatile memory device is disclosed. The method can include forming a lower electrode layer. The method can include forming a nanomaterial assembly layer on the lower electrode layer. The nanomaterial assembly layer includes a plurality of micro conductive bodies assembled via a gap. The method can include forming a sacrificial layer by causing a sacrificial material to penetrate into the gap in a lower part of the nanomaterial assembly layer. The method can include forming an upper electrode layer by causing a conductive material to penetrate into the gap in a portion of the nanomaterial assembly layer above the sacrificial layer. In addition, the method can include removing the sacrificial material.

In general, according to one embodiment, a method for manufacturing a nonvolatile memory device is disclosed. The method can include forming a lower electrode layer. The method can include forming a nanomaterial assembly layer on the lower electrode layer. The nanomaterial assembly layer includes a plurality of micro conductive bodies assembled via a gap. The method can include forming a sacrificial layer by causing a sacrificial material to penetrate into the gap in a lower part of the nanomaterial assembly layer. The method can include forming a reinforcing layer by causing a reinforcing material to penetrate into the gap in a lower part of a portion of the nanomaterial assembly layer above the sacrificial layer. The method can include forming an upper electrode layer by causing a conductive material to penetrate into the gap in a portion of the nanomaterial assembly layer above the reinforcing layer. In addition, the method can include removing the sacrificial material.

In general, according to one embodiment, a method for manufacturing a nonvolatile memory device is disclosed. The method can include forming a lower electrode layer. The method can include forming a nanomaterial assembly layer on the lower electrode layer. The nanomaterial assembly layer includes a plurality of micro conductive bodies assembled via a gap. The method can include forming a reinforcing layer by causing a reinforcing material to penetrate into the gap in a lower part of the nanomaterial assembly layer. The method can include forming a sacrificial layer by causing a sacrificial material to penetrate into the gap in a lower part of a portion of the nanomaterial assembly layer above the reinforcing layer. The method can include forming an upper electrode layer by causing a conductive material to penetrate into the gap in a portion of the nanomaterial assembly layer above the sacrificial layer. In addition, the method can include removing the sacrificial material.

In general, according to one embodiment, a method for manufacturing a nonvolatile memory device is disclosed. The method can include forming a lower electrode layer. The method can include forming a nanomaterial assembly layer on the lower electrode layer. The nanomaterial assembly layer includes a plurality of micro conductive bodies assembled via a gap. The method can include forming a first sacrificial layer by causing a sacrificial material to penetrate into the gap in a lower part of the nanomaterial assembly layer. The method can include forming a reinforcing layer by causing a reinforcing material to penetrate into the gap in a lower part of a portion of the nanomaterial assembly layer above the first sacrificial layer. The method can include forming a second sacrificial layer by causing the sacrificial material to penetrate into the gap in a lower part of a portion of the nanomaterial assembly layer above the reinforcing layer. The method can include forming an upper electrode layer by causing a conductive material to penetrate into the gap in a portion of the nanomaterial assembly layer above the second sacrificial layer. In addition, the method can include removing the sacrificial material.

Embodiments of the invention will now be described with reference to the drawings.

First, a first embodiment is described.

FIG. 1 is a perspective view illustrating a nonvolatile memory device according to this embodiment.

Figure 2:
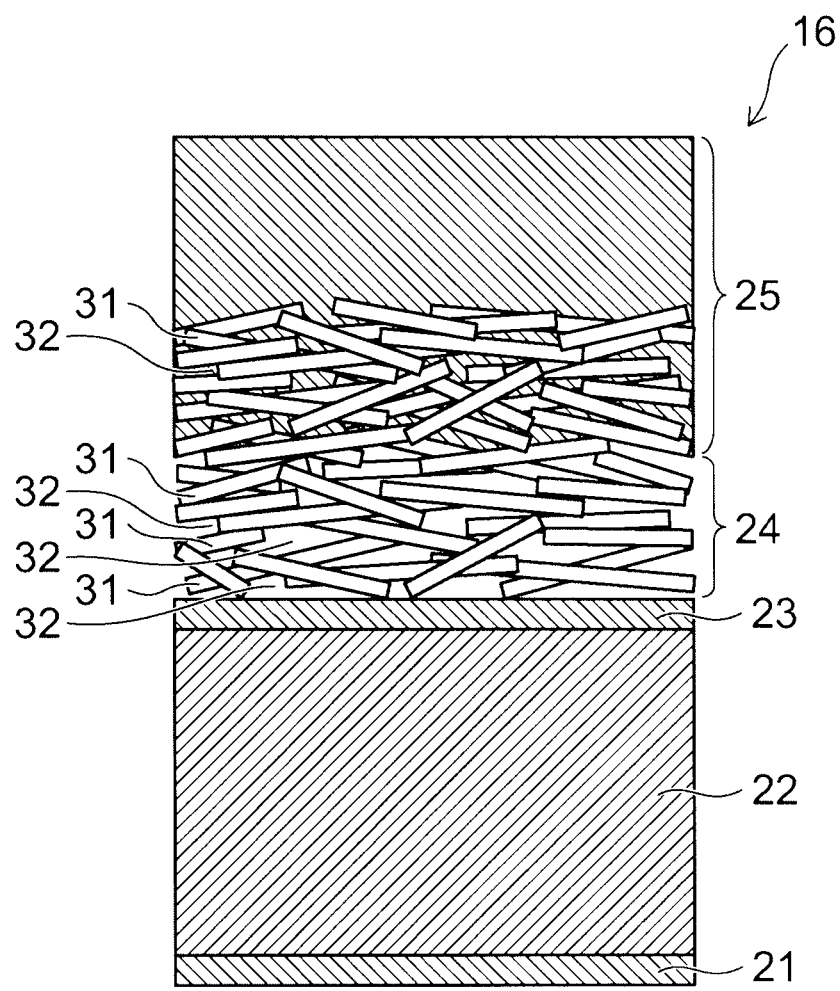
FIG. 2 is a schematic sectional view illustrating one pillar in the first embodiment.
Figure 2:

FIG. 2 is a schematic sectional view illustrating one pillar in this embodiment.

The nonvolatile memory device according to this embodiment is a ReRAM.

First, the nonvolatile memory device according to this embodiment is generally described.

In the nonvolatile memory device according to this embodiment, a pillar is provided between the bit line and the word line and constitutes a memory cell. In each pillar, a lower electrode layer, a nanomaterial assembly layer, and an upper electrode layer are stacked in this order. The nanomaterial assembly layer is a hollow structure layer in which carbon nanotubes (CNTs) serving as micro conductive bodies are loosely assembled via gaps. Each CNT can move in a microscopic range. For instance, one CNT can change its position and attitude in the space surrounded by adjacent CNTs. The lower electrode layer and the upper electrode layer are formed from a conductive material such as tungsten (W) or titanium nitride (TiN). In the lower part of the upper electrode layer, the CNTs constituting the nanomaterial assembly layer are partly buried. In the initial state, the CNTs are separated from each other, and the electrical resistance between the lower electrode layer and the upper electrode layer is high. When a voltage is applied between the lower electrode layer and the upper electrode layer, adjacent CNTs are brought into contact with each other by the Coulomb force to form a current path. This decreases the electrical resistance between the lower electrode layer and the upper electrode layer. This state persists even after the voltage is turned off. In this embodiment, the CNTs are partly buried in the lower part of the upper electrode layer. This results in high adhesiveness between the nanomaterial assembly layer and the upper electrode layer. Thus, the reliability can be ensured even if the pillar is finely formed.

Next, a method for manufacturing a nonvolatile memory device according to this embodiment is generally described.

A nanomaterial assembly layer is formed on the lower electrode layer. Then, a sacrificial material is caused to penetrate into the gap between the CNTs in the lower part of the nanomaterial assembly layer, and solidified. Thus, the CNTs are partly buried with the solid sacrificial material, and the lower part of the nanomaterial assembly layer becomes a sacrificial layer. Next, a conductive material (e.g., tungsten) is caused to penetrate into the gap between the CNTs in the upper part of the nanomaterial assembly layer, and the conductive material is deposited also on the nanomaterial assembly layer to form an upper electrode layer. Thus, the upper electrode layer is formed on the sacrificial layer, and CNTs are buried in the lower part of the upper electrode layer. Next, the upper electrode layer, the sacrificial layer, and the lower electrode layer are processed into a pillar. Subsequently, the sacrificial material is removed to return the sacrificial layer to the nanomaterial assembly layer. In this method, when the upper electrode layer is formed, the lower part of the nanomaterial assembly layer is buried with the sacrificial material. Hence, the conductive material does not penetrate into the lower part of the nanomaterial assembly layer. Accordingly, the interface between the nanomaterial assembly layer and the upper electrode layer is made flat, and the thickness of the nanomaterial assembly layer is made uniform. Thus, the electrical characteristics of the nanomaterial assembly layer can be made uniform. Furthermore, the CNTs partly buried in the upper electrode layer increase the adhesiveness between the nanomaterial assembly layer and the upper electrode layer. This facilitates fine processing of the pillar. Furthermore, when CMP (chemical mechanical polishing) is performed on a pattern wider than the pillar, the nanomaterial assembly layer is resistant to detachment.

Next, the nonvolatile memory device according to this embodiment is described in detail.

As shown in FIG. 1, the nonvolatile memory device 1 according to this embodiment includes a silicon substrate 11. A driver circuit (not shown) for the nonvolatile memory device 1 is formed in an upper portion and on the upper surface of the silicon substrate 11. An interlayer insulating film 12 illustratively made of silicon oxide is provided on the silicon substrate 11 so as to bury the driver circuit. A memory cell unit 13 is provided on the interlayer insulating film 12.

In the memory cell unit 13, word line interconnect layers 14 and bit line interconnect layers 15 are alternately stacked via insulating layers. The word line interconnect layer 14 includes a plurality of word lines WL extending in one direction (hereinafter referred to as "word line direction") parallel to the upper surface of the silicon substrate 11. The bit line interconnect layer 15 includes a plurality of bit lines BL extending in a direction (hereinafter referred to as "bit line direction") being parallel to the upper surface of the silicon substrate 11 and crossing, such as being orthogonal to, the word line direction. The adjacent word lines WL, the adjacent bit lines BL, and the word line WL and the bit line BL are not in contact with each other.

At the nearest point between each word line WL and each bit line BL, a pillar 16 extending in the direction (hereinafter referred to as "vertical direction") perpendicular to the upper surface of the silicon substrate 11 is provided. The pillar 16 is formed between the word line WL and the bit line BL. One pillar 16 constitutes one memory cell. That is, the nonvolatile memory device 1 is a cross-point device in which a memory cell is located at each nearest point between the word line WL and the bit line BL. An interlayer insulating film (not shown) is buried among the word line WL, the bit line BL, and the pillar 16.

In the following, the configuration of the pillar 16 is described with reference to FIG. 2.

As shown in FIG. 2, in each pillar 16, from bottom to top, a barrier metal layer 21, a silicon diode layer 22, a lower electrode layer 23, a nanomaterial assembly layer 24, and an upper electrode layer 25 are stacked in this order. The barrier metal layer 21 is in contact with e.g. a word line WL (see FIG. 1). The upper electrode layer 25 is in contact with e.g. a bit line BL (see FIG. 1).

The barrier metal layer 21 is illustratively made of titanium nitride (TiN) or tantalum nitride (TaN). The silicon diode layer 22 is illustratively made of polysilicon in which, sequentially from bottom, an n-type layer having $n^+$-type conductivity, an i-type layer made of an intrinsic semiconductor, and a p-type layer having $p^+$-type conductivity are stacked. Thus, the silicon diode layer 22 functions as a select element which passes a current only when, for instance, the bit line BL is supplied with a higher potential than the word line WL, and which does not pass the current in the opposite direction.

As described above, the nanomaterial assembly layer 24 is a layer in which CNTs (carbon nanotubes) 31 are assembled via gaps 32. The gap 32 is an air layer. Hence, the nanomaterial assembly layer 24 has a hollow structure. The number of layers of CNTs 31 stacked in the thickness direction of the nanomaterial assembly layer 24 is e.g. approximately several to several ten layers. The lower electrode layer 23 and the upper electrode layer 25 are formed from a conductive material such as tungsten, titanium nitride, tungsten nitride (WN), tantalum nitride (TaN), or titanium silicide (TiSi). In the lower part of the upper electrode layer 25, the CNTs 31 constituting the nanomaterial assembly layer 24 are partly buried.

Next, a method for manufacturing a nonvolatile memory device according to this embodiment is described.

Figure 3:
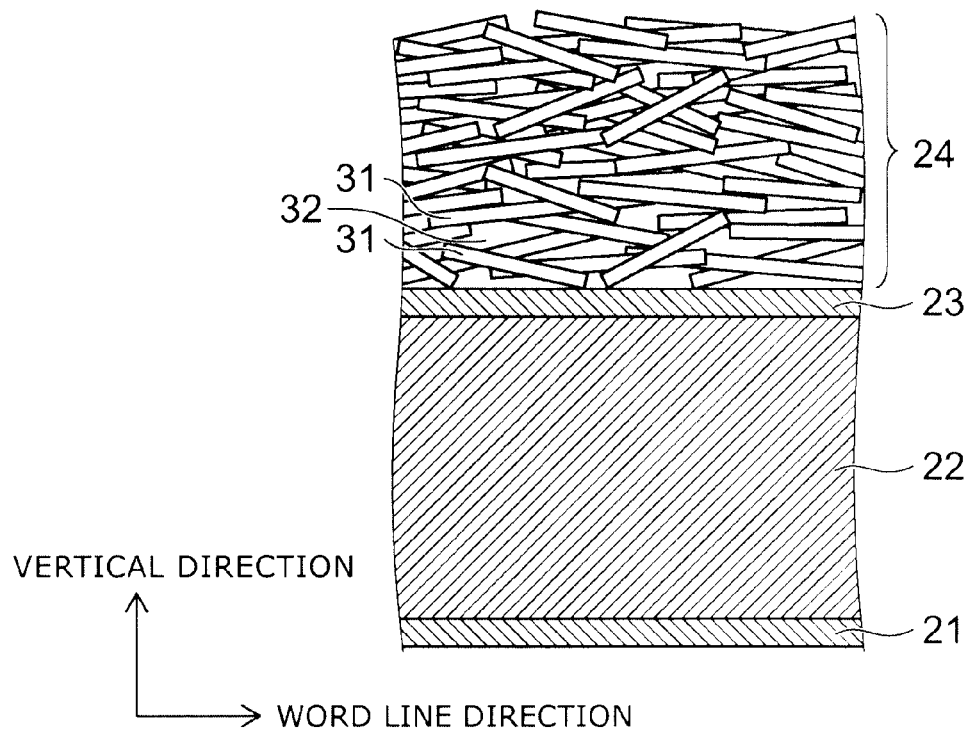
FIGS. 3 to 5 are process sectional views schematically illustrating a method for manufacturing the nonvolatile memory device according to the first embodiment.
Figure 4:
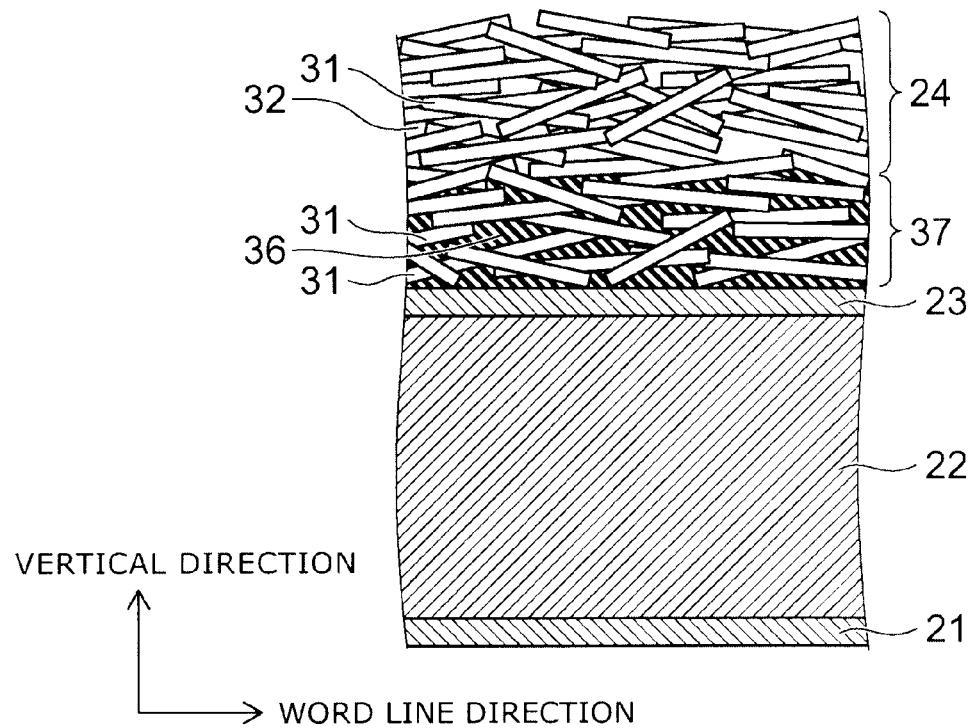
Figure 5:
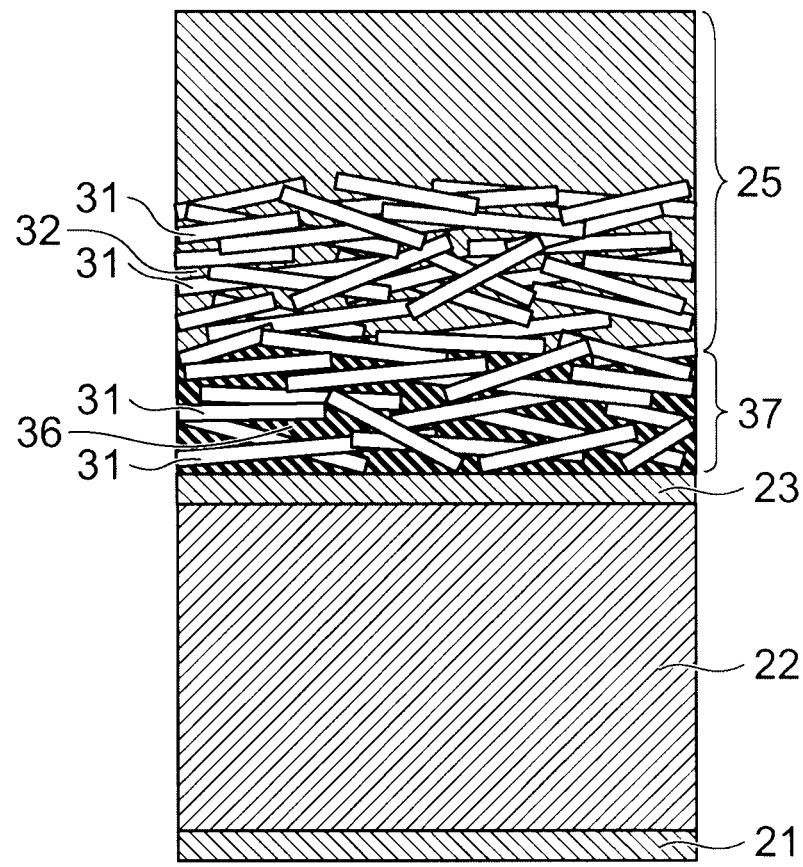

FIGS. 3 to 5 are process sectional views schematically illustrating the method for manufacturing a nonvolatile memory device according to this embodiment.

First, as shown in FIG. 1, a driver circuit for driving the memory cell unit 13 is formed in the upper surface of a silicon substrate 11. Next, an interlayer insulating film 12 is formed on the silicon substrate 11. Next, contacts (not shown) extending to the driver circuit are formed in the interlayer insulating film 12. Next, tungsten is buried in an upper portion of the interlayer insulating film 12 by e.g. the damascene method. Thus, a plurality of word lines WL are formed parallel to each other so as to extend in the word line direction. These word lines WL form a word line interconnect layer 14.

Next, as shown in FIG. 3, titanium nitride (TiN), for instance, is deposited on the word line interconnect layer 14 to form a barrier metal layer 21. Next, amorphous silicon is deposited on the barrier metal layer 21. At this time, while depositing amorphous silicon, impurities are introduced to continuously form an n-type layer, an i-type layer, and a p-type layer. The barrier metal layer 21 is a barrier layer for suppressing reaction between tungsten forming the word line WL and silicon forming the silicon diode layer 22. Next, on the silicon diode layer 22, a conductive material such as tungsten or titanium nitride is deposited to form a lower electrode layer 23.

Next, a dispersion liquid with CNTs 31 dispersed therein is applied onto the lower electrode layer 23, and dried. Thus, a nanomaterial assembly layer 24 is formed. In the nanomaterial assembly layer 24, a plurality of CNTs 31 are loosely coupled to each other by the van der Waals force, and gaps 32 are formed between the CNTs 31. In the process in which the dispersion liquid is dried and the thickness is reduced, the extending direction of the CNTs 31 is made close to the horizontal direction, i.e., the direction parallel to the plane formed by the word line direction and the bit line direction.

Next, as shown in FIG. 4, a liquid insulative sacrificial material 36 is applied and infiltrated into the lower part of the nanomaterial assembly layer 24. Thus, the sacrificial material 36 penetrates into the gap 32 formed in the lower part of the nanomaterial assembly layer 24. The sacrificial material 36 can illustratively be a silicon-containing organic material, such as "SILK" manufactured by The Dow Chemical Company ("SiLK" is a trademark of The Dow Chemical Company). Next, heat treatment is performed at a temperature of e.g. 300-450° C. to solidify the sacrificial material 36. Thus, the lower part of the nanomaterial assembly layer 24 becomes a sacrificial layer 37 in which CNTs 31 are buried with the solid sacrificial material 36. The surface roughness of the upper surface of the sacrificial layer 37 can be controlled by selecting the application condition and heat treatment condition for the sacrificial material 36.

Next, as shown in FIG. 5, a conductive material such as tungsten or titanium nitride is deposited from above the nanomaterial assembly layer 24. This deposition is performed under the condition that the surface coverage ratio is made higher. For instance, the deposition is performed by the CVD (chemical vapor deposition) method or ALD (atomic layer deposition) method with a carrier gas of small molecules. Furthermore, this deposition is performed at a temperature at which the insulating layer 37 is not destroyed. For instance, in the case of using the aforementioned "SiLK" (trademark of The Dow Chemical Company) as the sacrificial material 36, the thermal stability of this material is guaranteed at temperatures equal to or less than 450° C. Hence, the aforementioned deposition of the conductive material is performed at a temperature of 450° C. or less.

Thus, the conductive material passes through the gap 32 of the nanomaterial assembly layer 24 and is deposited on the sacrificial layer 37. That is, the conductive material penetrates into the gap 32 in the portion of the nanomaterial assembly layer 24 above the sacrificial layer 37. Also after the conductive material fills up the gaps 32 above the sacrificial layer 37, the deposition of the conductive material is continued, and the conductive material is deposited on the nanomaterial assembly layer 24. Thus, an upper electrode layer 25 is formed on the sacrificial layer 37. In the lower part of the upper electrode layer 25 thus formed, CNTs 31 are buried. In other words, the portion originally constituting the upper part of the nanomaterial assembly layer 24 loses the function of the nanomaterial assembly layer by infiltration of the conductive material and becomes an upper electrode layer 25. Here, in the sacrificial layer 37, the sacrificial material 36 has already been buried in the gaps 32. Hence, the conductive material does not penetrate into the sacrificial layer 37. Thus, the sacrificial layer 37 and the upper electrode layer 25 are brought into contact with each other. The surface roughness of the lower surface of the upper electrode layer 25 is made comparable to the surface roughness of the upper surface of the sacrificial layer 37.

Next, a hard mask (not shown) is formed on the upper electrode layer 25, and a resist film (not shown) is formed. Next, by exposure and development, the resist film is patterned to form a resist pattern. Next, this resist pattern is used as a mask to pattern the hard mask. Next, the patterned hard mask is used as a mask to perform anisotropic etching such as RIE (reactive ion etching). Thus, the upper electrode layer 25, the nanomaterial assembly layer 24 turned into the sacrificial layer 37, the lower electrode layer 23, the silicon diode layer 22, and the barrier metal layer 21 are selectively removed and divided along both the word line direction and the bit line direction. Accordingly, pillars 16 (see FIG. 1) are formed.

Next, heat treatment is performed at the vaporizing temperature of the sacrificial material 36, such as approximately 600° C. Thus, the sacrificial material 36 is vaporized away. At this time, because the sacrificial layer 37 is exposed at the side surface of the pillar 16, the sacrificial material 36 is easily removed. Consequently, as shown in FIG. 2, the sacrificial layer 37 returns to the nanomaterial assembly layer 24 in which CNTs 31 are loosely coupled to each other via gaps 32.

Next, a liner film (not shown) is formed on the upper surface and side surface of the pillar 16 by e.g. the ALD method or the CVD method. Next, an insulating material is deposited to form an interlayer insulating film (not shown) so that the pillar 16 is buried therein. Next, the upper electrode layer 25 is used as a stopper to perform CMP (chemical mechanical polishing) treatment. Thus, the upper surface of the interlayer insulating film is planarized, and the upper electrode layer 25 is exposed at the upper surface of the interlayer insulating film.

Next, as shown in FIG. 1, on the interlayer insulating film, another interlayer insulating film (not shown) is formed, and bit lines BL are formed by e.g. the damascene method. The bit line BL is formed from e.g. tungsten. These bit lines BL form a bit line interconnect layer 15. Each bit line BL is connected to the upper surface of a plurality of pillars 16 arranged in the bit line direction. Thus, each pillar 16 is formed between the word line WL and the bit line BL, and connected to the word line WL and the bit line BL.

Next, pillars 16 are formed on the bit line BL. In forming this pillar 16, the stacking order of the n-type layer, the i-type layer, and the p-type layer in the silicon diode layer 22 is reversed with respect to the aforementioned pillar 16 formed on the word line WL. Subsequently, by a similar method, a word line interconnect layer 14, a plurality of pillars 16, a bit line interconnect layer 15, and a plurality of pillars 16 are formed repetitively. Thus, the nonvolatile memory device 1 according to this embodiment is manufactured.

Next, the operation of this embodiment is described.

In the nonvolatile memory device 1 according to this embodiment, when no voltage is applied between the lower electrode layer 23 and the upper electrode layer 25, CNTs 31 in the nanomaterial assembly layer 24 are generally separated from each other. Thus, a relatively high resistance state is established between the lower electrode layer 23 and the upper electrode layer 25. On the other hand, when a voltage is applied between the lower electrode layer 23 and the upper electrode layer 25, a Coulomb force occurs between CNTs 31 and attracts them to each other. If this voltage is applied continuously for a certain time or more, the CNT 31 moves and rotates by the Coulomb force, and is brought into contact with the adjacent CNT 31. Thus, a current path is formed between the lower electrode layer 23 and the upper electrode layer 25 via a plurality of CNTs 31. Consequently, a relatively low resistance state is established between the lower electrode layer 23 and the upper electrode layer 25. This state is maintained even after the application of the voltage between the lower electrode layer 23 and the upper electrode layer 25 is stopped. Furthermore, if a voltage is applied for a short time between the lower electrode layer 23 and the upper electrode layer 25, the contact portion between the CNTs 31 generates heat, and the CNTs 31 are separated from each other. Consequently, the nanomaterial assembly layer 24 returns to the high resistance state. Thus, the nanomaterial assembly layer 24 can have the two states, i.e., the "high resistance state" and the "low resistance state". Hence, binary data can be stored therein. Such a behavior also occurs between the lower electrode layer 23 and the CNT 31.

Next, the effect of this embodiment is described.

According to this embodiment, the lower part of the nanomaterial assembly layer 24 is once buried with a sacrificial material 36 to form a sacrificial layer 37. A conductive material is deposited on the sacrificial layer 37 to form an upper electrode layer 25. Subsequently, the sacrificial material 36 is removed. Thus, the upper electrode layer 25 can be formed while preventing the conductive material from penetrating deeply into the nanomaterial assembly layer 24. Here, the surface roughness of the lower surface of the upper electrode layer 25 is made generally comparable to the surface roughness of the upper surface of the sacrificial layer 37, and the upper surface of the sacrificial layer 37 can be formed flat. Hence, the lower surface of the upper electrode layer 25 can also be formed flat. Furthermore, the thickness of the nanomaterial assembly layer 24 after the removal of the sacrificial material 36 is determined by the thickness of the sacrificial layer 37, and the thickness of the insulating layer 37 can be controlled with high accuracy on the order of e.g. 5 nm. Hence, the thickness of the nanomaterial assembly layer 24 can be accurately controlled. Thus, the electrical characteristics of the nanomaterial assembly layer 24 can also be made uniform. Hence, the characteristics variation of memory cells can be suppressed even if the pillar 16 is finely processed. In other words, memory cells can be highly integrated while limiting the characteristics variation of memory cells to within a prescribed range.

In contrast, if the upper electrode layer 25 is formed by depositing a conductive material without providing the sacrificial layer 37, the conductive material penetrates deeply into the nanomaterial assembly layer 24. Then, the conductive material may interfere with the motion and rotation of the CNT 31, short-circuit the lower electrode layer 23 with the upper electrode layer 25, degrade the material quality of the nanomaterial assembly layer 24, or deteriorate the electrical characteristics. Furthermore, the effective thickness of the nanomaterial assembly layer 24 may be made nonuniform and cause characteristics variation. These possibilities are made significant particularly when the diameter of the pillar 16 is decreased to increase the integration density of memory cells, and when the thickness of the nanomaterial assembly layer 24 in the pillar 16 is thinned. These interfere with the increase of the integration density of memory cells.

Furthermore, in this embodiment, the CNTs 31 constituting the nanomaterial assembly layer 24 are partly buried in the upper electrode layer 25. Thus, the area of contact between the nanomaterial assembly layer 24 and the upper electrode layer 25 is increased, and the adhesiveness is enhanced. Consequently, this improves the reliability of the nonvolatile memory device 1, and facilitates fine processing of the pillar 16. In contrast, if the CNTs 31 are not buried in the upper electrode layer 25, the area of contact between the nanomaterial assembly layer 24 and the upper electrode layer 25 is small. Hence, the interface between these layers is prone to detachment.

Furthermore, in this embodiment, when the nanomaterial assembly layer 24 and the like are processed into pillars 16, the sacrificial material 36 has penetrated into the gap 32 in the sacrificial layer 37. Therefore, it can be prevented that the CNTs 31 are damaged by etching gas. Consequently, the options of processing means, such as etching gas, increases. Moreover, it can also be prevented that the CNTs 31 are damaged by the source gas and the heat, and the liner film penetrates into the gap 32 when the liner film is formed. Furthermore, the CNTs 31 can be fixed by the sacrificial material 36. Thus, as compared with the case where the sacrificial material 36 is not penetrated into the gap 32, the pillar 16 is easier to form, and memory cell can be highly integrated. Moreover, when CMP is performed on a pattern wider than the pillar, such as a pattern having a width of approximately several hundred nm to several μm, the nanomaterial assembly layer 24 is resistant to detachment.

Thus, according to this embodiment, the interface between the nanomaterial assembly layer 24 and the upper electrode layer 25 can be planarized. The effective film thickness of the nanomaterial assembly layer 24 can be made uniform. Furthermore, the adhesiveness between the nanomaterial assembly layer 24 and the upper electrode layer 25 can be enhanced. Thus, even if the pillar 16 is miniaturized, variation and degradation in the characteristics of memory cells can be suppressed, and the nonvolatile memory device can be highly integrated. Furthermore, the pillar 16 is processed more easily, and the characteristics of memory cells are made uniform. Hence, the device yield is increased, and the manufacturing cost can be reduced.

Here, the sacrificial material 36 may be made of silicon nitride (SiN) instead of the aforementioned "SiLK". In this case, silicon nitride is soluble in phosphoric acid ($H_3PO_4$). Hence, the sacrificial material 36 can be removed by phosphoric acid treatment instead of heat treatment. Furthermore, in the example of this embodiment described above, the sacrificial material 36 is removed after the pillar 16 is processed. However, the pillar 16 may be processed after the sacrificial material 36 is removed.

Next, a second embodiment is described.

Figure 6:
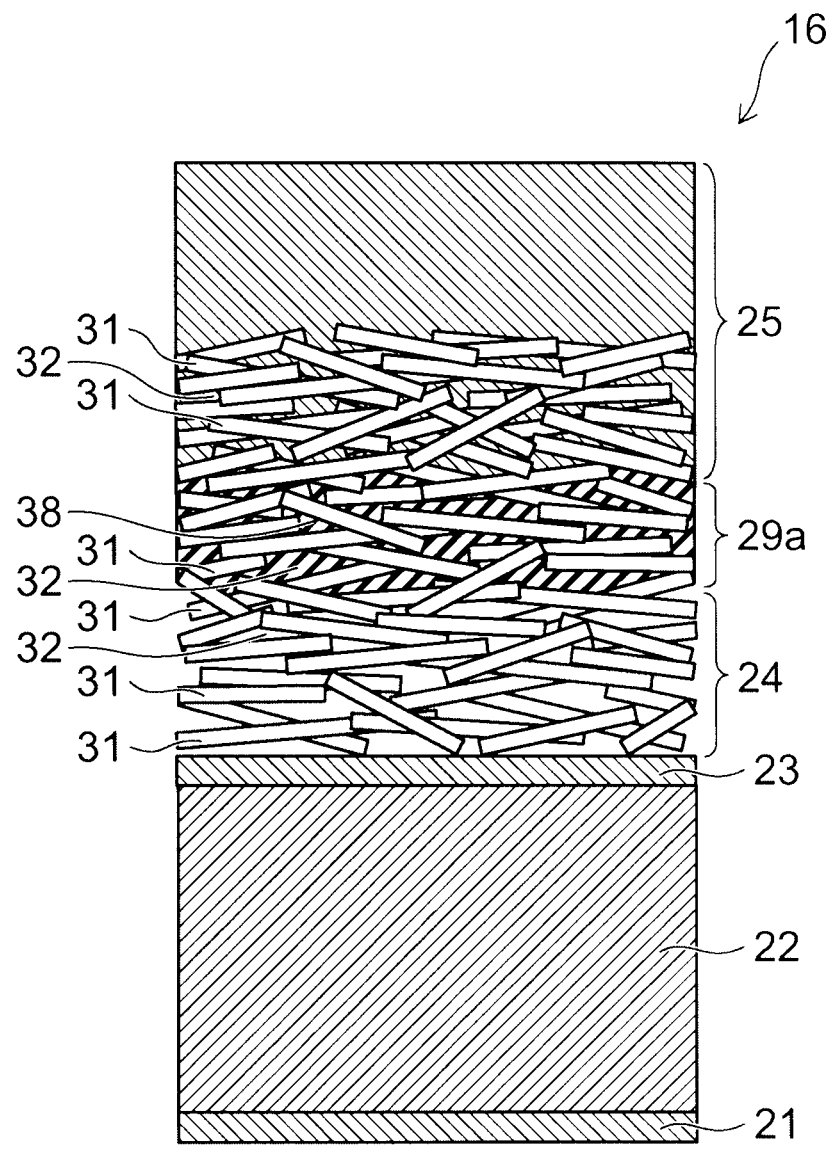
FIG. 6 is a schematic sectional view illustrating one pillar in a second embodiment.

FIG. 6 is a schematic sectional view illustrating one pillar in this embodiment.

As shown in FIG. 6, this embodiment is different from the above first embodiment (see FIG. 2) in that each pillar 16 includes a reinforcing layer 29a between the nanomaterial assembly layer 24 and the upper electrode layer 25. The reinforcing layer 29a is in contact with the upper electrode layer 25. The reinforcing layer 29a is made of a reinforcing material 38 in which carbon nanotubes (CNTs) 31 are buried. The reinforcing material 38 is illustratively a heat-resistant silicon-based polymer, such as SOG (spin on glass) material, or "T8-diyne" or "T8-diene" manufactured by the National Institute of Advanced Industrial Science and Technology (AIST). The portion of the CNTs 31 constituting the nanomaterial assembly layer 24 and not buried in the upper electrode layer 25 is partly buried in the reinforcing layer 29a. Furthermore, part of the CNTs 31 buried in the reinforcing layer 29a penetrates through the reinforcing layer 29a, ensuring the conductivity of the reinforcing layer 29a. The configuration of this embodiment other than the foregoing is similar to that of the above first embodiment.

Next, a method for manufacturing a nonvolatile memory device according to this embodiment is described.

Figure 7:
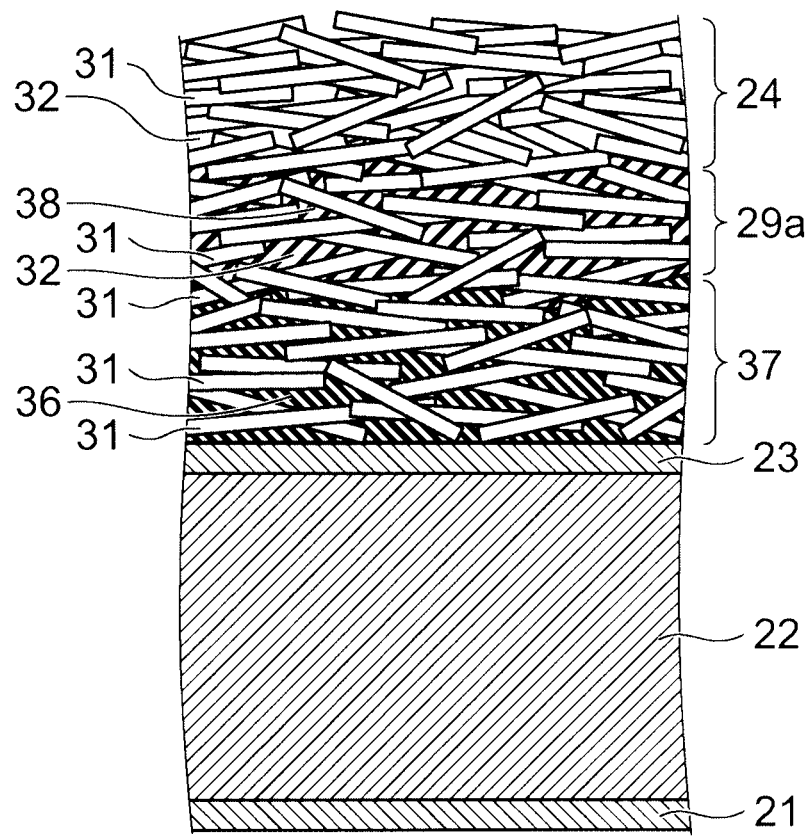
FIGS. 7 and 8 are process sectional views schematically illustrating a method for manufacturing the nonvolatile memory device according to the second embodiment.
Figure 8:
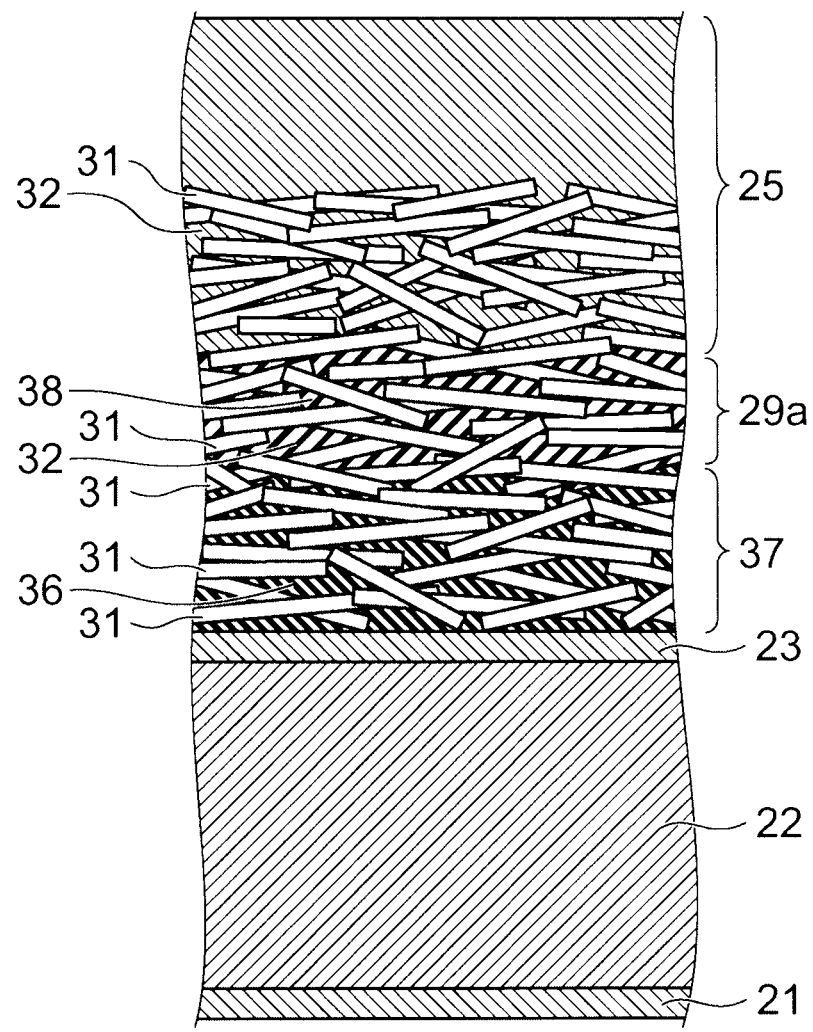

FIGS. 7 and 8 are process sectional views schematically illustrating the method for manufacturing a nonvolatile memory device according to this embodiment.

In the manufacturing method according to this embodiment, processes up to the process shown in FIG. 4 are similar to those of the above first embodiment. That is, a sacrificial material 36 is infiltrated into the lower part of the nanomaterial assembly layer 24 to form a sacrificial layer 37.

Next, as shown in FIG. 7, a solution containing a reinforcing material 38, such as a solution of the aforementioned heat-resistant silicon-based polymer, e.g., a solution with the aforementioned "T8-diyne" dissolved in an organic solvent, is applied from above the nanomaterial assembly layer 24. Thus, the reinforcing material 38 penetrates into the gap 32 in the lower part of the portion of the nanomaterial assembly layer 24 above the sacrificial layer 37. At this time, the reinforcing material 38 is not infiltrated into the uppermost part of the nanomaterial assembly layer 24. Next, heat treatment is performed to heat-cure the reinforcing material 38. Thus, a reinforcing layer 29a is formed on the sacrificial layer 37. At this time, above the reinforcing layer 29a, the nanomaterial assembly layer 24 with unfilled gaps 32 remains, and part of the CNTs 31 penetrates through the reinforcing layer 29a.

Next, as shown in FIG. 8, a conductive material is deposited from above the nanomaterial assembly layer 24. Thus, the conductive material is caused to penetrate into the gaps 32 in the portion of the nanomaterial assembly layer 24 above the reinforcing layer 29a. Subsequently, the conductive material is deposited also on the nanomaterial assembly layer 24. Thus, an upper electrode layer 25 is formed on the reinforcing layer 29a. In the lower part of the upper electrode layer 25, CNTs 31 are partly buried. However, unlike the above first embodiment, the deposition temperature of the conductive material at this time does not depend on the heat resistance temperature of the sacrificial material 36. The reason for this is as follows. In the subsequent process, the reinforcing layer 29a, instead of the sacrificial layer 37, can prevent the conductive material from penetrating into the nanomaterial assembly layer 24. Hence, the sacrificial layer 37 does not necessarily need to be retained. The deposition temperature of the conductive material needs to be equal to or less than the heat resistance temperature of the reinforcing layer 29a. However, the heat resistance temperature of the reinforcing layer 29a, which does not need to be removed in a later process, can be made higher than the heat resistance temperature of the sacrificial layer 37 to be removed in a later process. For instance, the aforementioned "T8-diyne" is thermally stable up to 1000° C. in inert gas, and up to 584° C. in the atmosphere. The thermal stability of "T8-diene" and SOG is superior to that of "T8-diyne". "T8-diyne" is a material for film formation by coating, whereas "T8-diene" is a material for film formation by melting. In film formation, "T8-diene" is melted by heating to the melting point, 100° C. Once melted and then solidified, "T8-diene" is not remelted, exhibiting high thermal stability.

Next, as shown in FIG. 6, the upper electrode layer 25, the reinforcing layer 29a, the sacrificial layer 37, the lower electrode layer 23, the silicon diode layer 22, and the barrier metal layer 21 are selectively removed and patterned to form pillars 16. Next, heat treatment is performed at a temperature of e.g. 600° C. to vaporize away the sacrificial material 36. The manufacturing method of this embodiment other than the foregoing is similar to that of the above first embodiment.

Next, the effect of this embodiment is described.

In this embodiment, a reinforcing layer 29a is provided between the nanomaterial assembly layer 24 and the upper electrode layer 25. As described above, the reinforcing layer 29a is formed from a material having high thermal stability such as a heat-resistant silicon-based polymer. Hence, the reinforcing layer 29a remains even after the sacrificial layer 37 is removed. Thus, the conductive material forming the upper electrode layer 25 can be constantly prevented from penetrating into the nanomaterial assembly layer 24 not only in the process of forming the upper electrode layer 25 but also in the subsequent thermal process. Furthermore, the presence of the reinforcing layer 29a having high strength can further enhance the adhesiveness between the nanomaterial assembly layer 24 and the upper electrode layer 25. Furthermore, the presence of the reinforcing layer 29a further reduces the surface roughness of the lower surface of the upper electrode layer 25. The operation and effect of this embodiment other than the foregoing are similar to those of the above first embodiment. In the example of this embodiment described above, the sacrificial material 36 is removed after the pillar 16 is processed. However, the pillar 16 may be processed after the sacrificial material 36 is removed.

Next, a third embodiment is described.

This embodiment is different from the above second embodiment in the type of the sacrificial material 36 and the reinforcing material 38. In this embodiment, the sacrificial material 36 is water, and the reinforcing material 38 is a resist material, such as naphthol novolac.

Next, a method for manufacturing a nonvolatile memory device in this embodiment is described.

As shown in FIG. 3, by a method similar to that of the above first embodiment, a nanomaterial assembly layer 24 is formed on the lower electrode layer 23. Next, as shown in FIG. 4, liquid water as the sacrificial material 36 is infiltrated into the lower part of the nanomaterial assembly layer 24. Next, as shown in FIG. 7, a liquid resist material, such as naphthol novolac dissolved in a thinner is applied. At this time, the thinner solution of naphthol novolac floats on the sacrificial material 36 made of water and forms a liquid layer. Next, by exposure, naphthol novolac is solidified to form a reinforcing layer 29a. Next, water and the thinner are removed by e.g. spin coating, reduced pressure vaporization, or heating vaporization. Next, a conductive material is deposited from above to form an upper electrode layer 25. However, the deposition temperature at this time is a temperature equal to or less than 384° C., at which the thermal stability of the naphthol novolac solidified layer is guaranteed. The subsequent process of the manufacturing method is similar to that of the above first embodiment.

According to this embodiment, as compared with the above second embodiment, the sacrificial material 36 is water. This reduces the manufacturing cost and environmental load. Furthermore, the reinforcing material 38 is a readily available resist material. This reduces the manufacturing cost. However, if it is desired to increase the deposition temperature of the conductive material, the above second embodiment is more favorable. The configuration, manufacturing method, operation, and effect of this embodiment other than the foregoing are similar to those of the above second embodiment.

In this embodiment, after liquid water is applied as the sacrificial material 36, this water may be frozen to form a sacrificial layer 37 made of ice. This facilitates forming the reinforcing layer 29a and enhances the shape stability of the reinforcing layer 29a. In this case, after the reinforcing layer 29a is formed, the ice can be melted, and then removed.

Next, a fourth embodiment is described.

Figure 9:
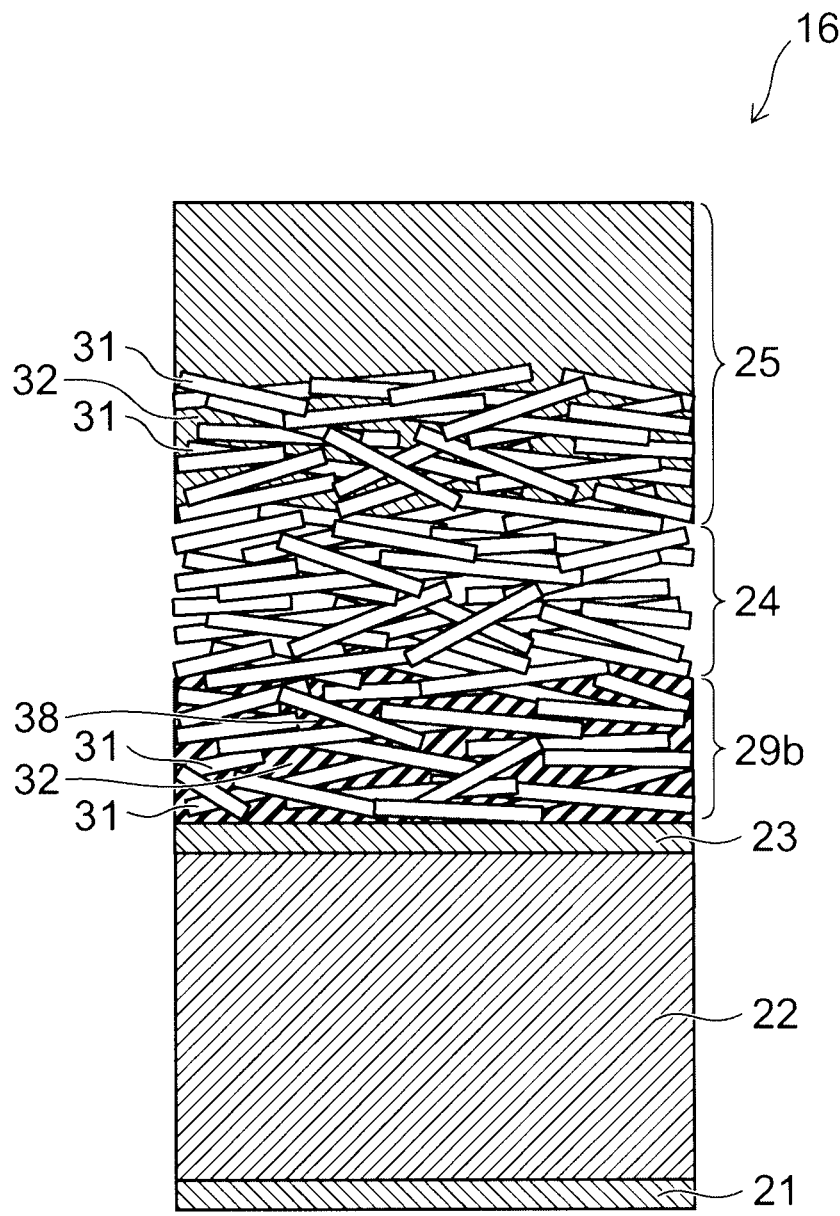
FIG. 9 is a schematic sectional view illustrating one pillar in a fourth embodiment.
Figure 9:
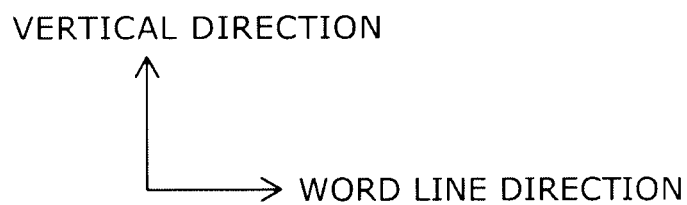

FIG. 9 is a schematic sectional view illustrating one pillar in this embodiment.

As shown in FIG. 9, this embodiment is different from the above second embodiment in that instead of the reinforcing layer 29a (see FIG. 6), a reinforcing layer 29b is provided between the lower electrode layer 23 and the nanomaterial assembly layer 24. The reinforcing layer 29b is in contact with the lower electrode layer 23. Like the reinforcing layer 29a in the above second embodiment, the reinforcing layer 29b is formed from e.g. a heat-resistant silicon-based polymer, such as SOG material, or "T8-diyne" or "T8-diene" manufactured by the National Institute of Advanced Industrial Science and Technology (AIST). The reinforcing layer 29b buries part of the CNTs 31 constituting the nanomaterial assembly layer 24. The configuration of this embodiment other than the foregoing is similar to that of the above second embodiment.

Next, a method for manufacturing a nonvolatile memory device according to this embodiment is described.

Figure 10:
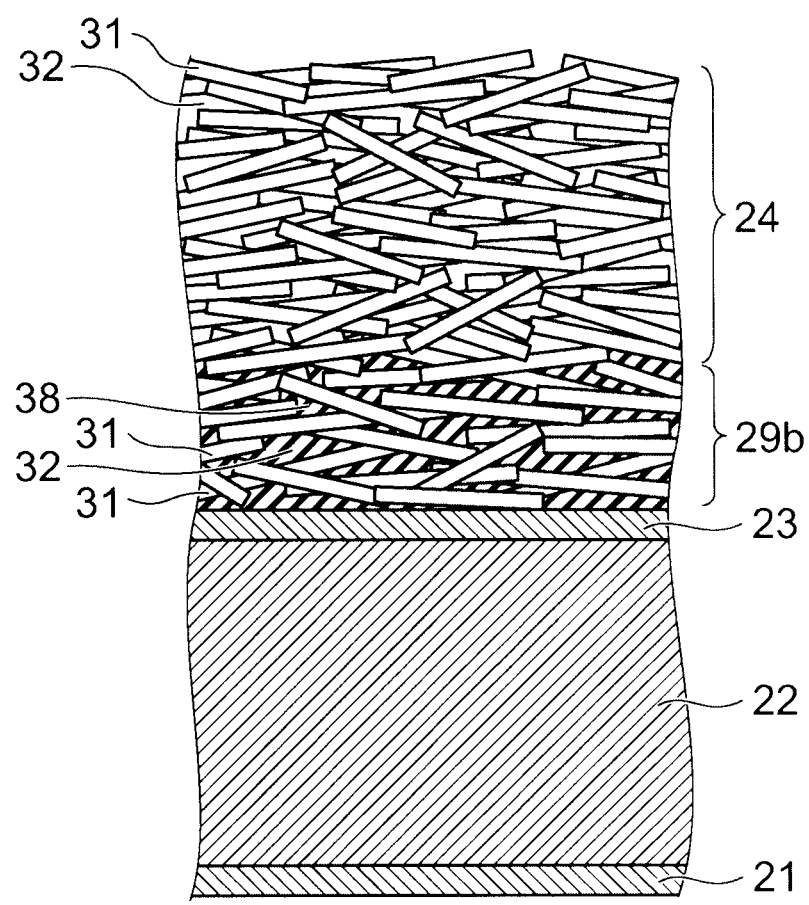
FIGS. 10 to 12 are process sectional views schematically illustrating a method for manufacturing the nonvolatile memory device according to the fourth embodiment.
Figure 11:
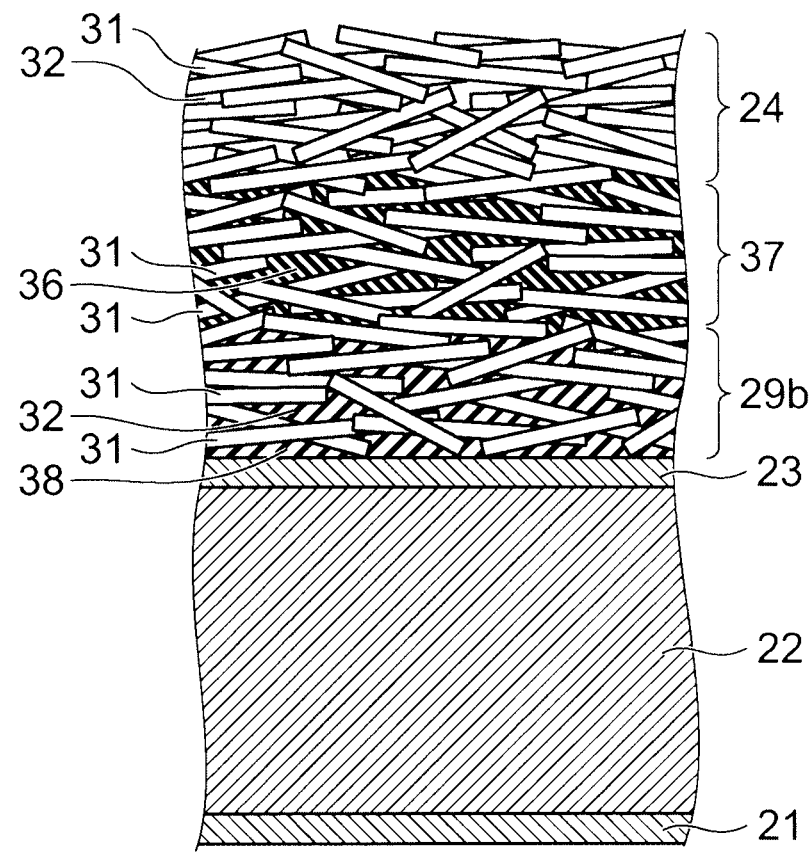
Figure 12:
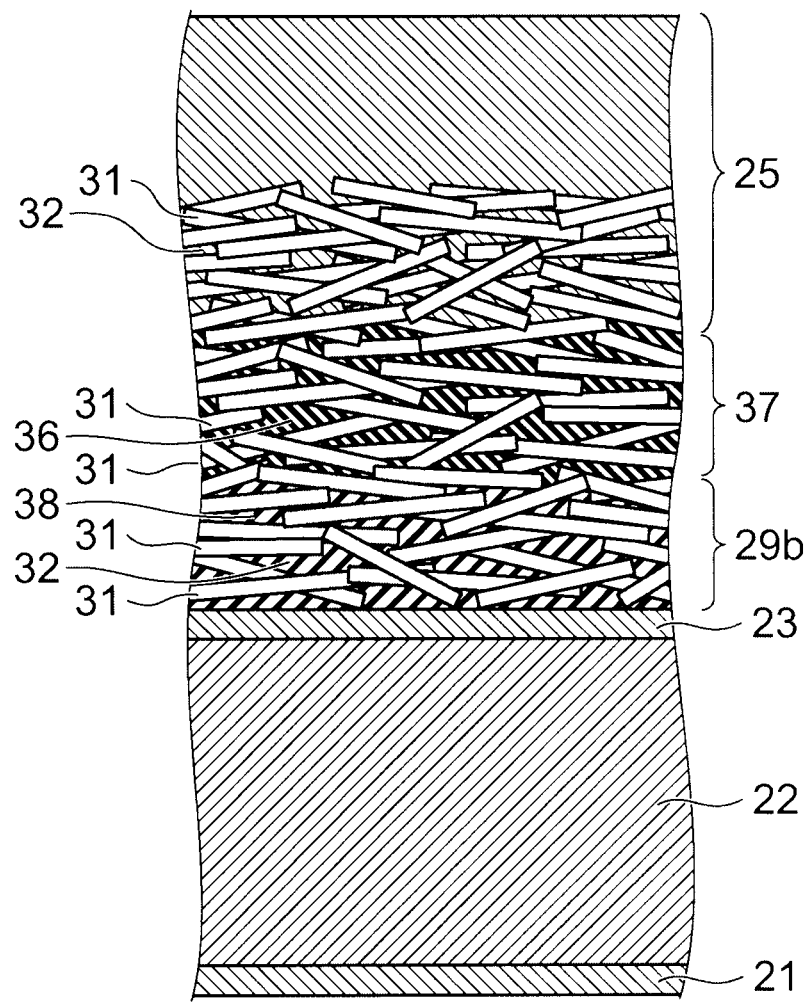

FIGS. 10 to 12 are process sectional views schematically illustrating the method for manufacturing a nonvolatile memory device according to this embodiment.

In the manufacturing method according to this embodiment, processes up to the process shown in FIG. 3 are similar to those of the above first embodiment. That is, on the word line interconnect layer 14 (see FIG. 1), a barrier metal layer 21, a silicon diode layer 22, a lower electrode layer 23, and a nanomaterial assembly layer 24 are deposited in this order.

Next, as shown in FIG. 10, a reinforcing material 38, such as a raw material of the aforementioned heat-resistant silicon-based polymer, is applied from above the nanomaterial assembly layer 24. Thus, the reinforcing material 38 penetrates into the gap 32 in the lower part of the nanomaterial assembly layer 24. At this time, the reinforcing material 38 is not infiltrated into the upper part of the nanomaterial assembly layer 24. Next, heat treatment is performed to heat-cure the reinforcing material 38. Thus, a reinforcing layer 29b is formed in the lower part of the nanomaterial assembly layer 24. At this time, above the reinforcing layer 29b, the nanomaterial assembly layer 24 with unfilled gaps 32 remains, and part of the CNTs 31 penetrates through the reinforcing layer 29b.

Next, as shown in FIG. 11, in the lower part of the portion of the nanomaterial assembly layer 24 above the reinforcing layer 29b, a sacrificial material 36 is applied and infiltrated into the gap 32. As in the above first embodiment, the sacrificial material 36 is illustratively a silicon-containing organic material, such as "SILK" manufactured by The Dow Chemical Company ("SILK" is a trademark of The Dow Chemical Company). Next, heat treatment is performed at a temperature of e.g. 300-400° C. to solidify the sacrificial material 36. Thus, a sacrificial layer 37 is formed.

Next, as shown in FIG. 12, a conductive material is deposited to form an upper electrode layer 25 on the sacrificial layer 37. The subsequent process is similar to that of the above first embodiment. That is, processing into pillars 16 is performed, and the sacrificial material 36 is removed.

Next, the effect of this embodiment is described.

In this embodiment, a reinforcing layer 29b is provided between the lower electrode layer 23 and the nanomaterial assembly layer 24. Hence, for instance, in the heat treatment process for forming interconnects, the conductive material constituting the lower electrode layer 23 can be constantly prevented from penetrating into the nanomaterial assembly layer 24. Furthermore, the presence of the reinforcing layer 29b with the CNTs 31 partly buried therein can enhance the adhesiveness between the lower electrode layer 23 and the nanomaterial assembly layer 24. The operation and effect of this embodiment other than the foregoing are similar to those of the above first embodiment.

Next, a fifth embodiment is described.

Figure 13:
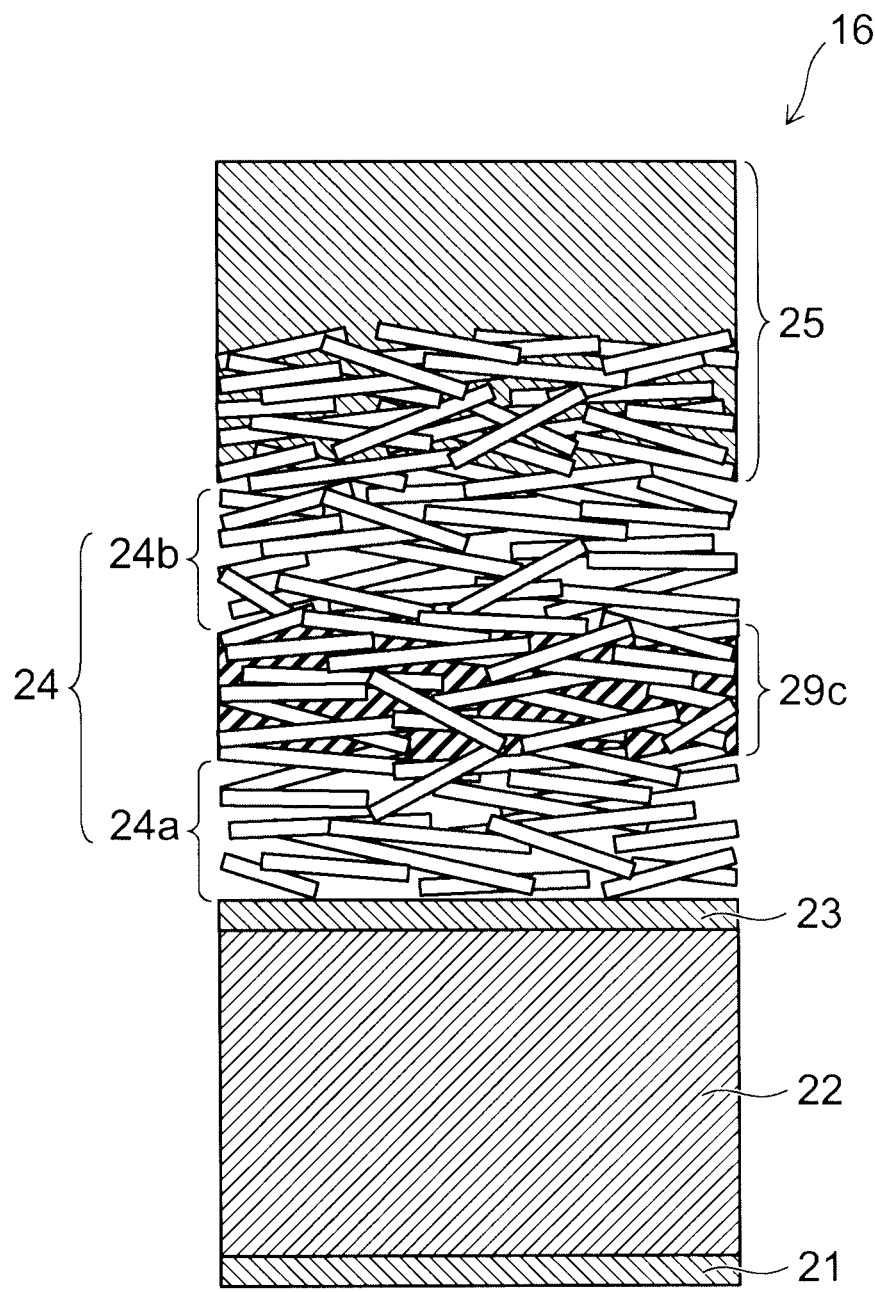
FIG. 13 is a schematic sectional view illustrating one pillar in a fifth embodiment.

FIG. 13 is a schematic sectional view illustrating one pillar in this embodiment.

As shown in FIG. 13, this embodiment is different from the above second embodiment in that instead of the reinforcing layer 29a (see FIG. 6), a reinforcing layer 29c is provided inside the nanomaterial assembly layer 24. The reinforcing layer 29c is provided midway in the thickness direction of the nanomaterial assembly layer 24, and divides the nanomaterial assembly layer 24 into a lower layer 24a and an upper layer 24b. Like the reinforcing layer 29a in the above second embodiment, the reinforcing layer 29c is formed from e.g. a heat-resistant silicon-based polymer. The CNTs 31 are partly buried in the reinforcing layer 29c. The configuration of this embodiment other than the foregoing is similar to that of the above second embodiment.

Next, a method for manufacturing a nonvolatile memory device according to this embodiment is described.

FIGS. 14 to 17 are process sectional views schematically illustrating the method for manufacturing a nonvolatile memory device according to this embodiment.

As shown in FIG. 3, by a method similar to that of the above first embodiment, on the word line interconnect layer 14 (see FIG. 1), a barrier metal layer 21, a silicon diode layer 22, a lower electrode layer 23, and a nanomaterial assembly layer 24 are deposited in this order.

Figure 14:
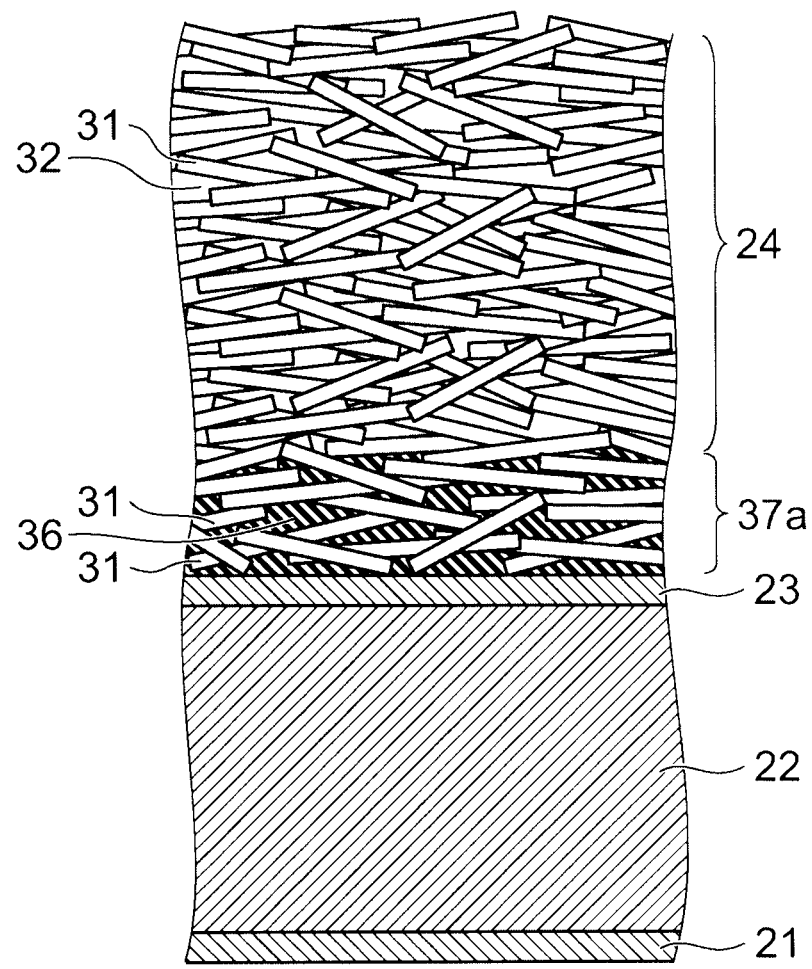
FIGS. 14 to 17 are process sectional views schematically illustrating a method for manufacturing the nonvolatile memory device according to the fifth embodiment.

Next, as shown in FIG. 14, a sacrificial material 36 is infiltrated into the lower part of the nanomaterial assembly layer 24 and caused to penetrate into the gap 32. Then, heat treatment is performed to solidify the sacrificial material 36. Thus, a sacrificial layer 37a is formed.

Figure 15:
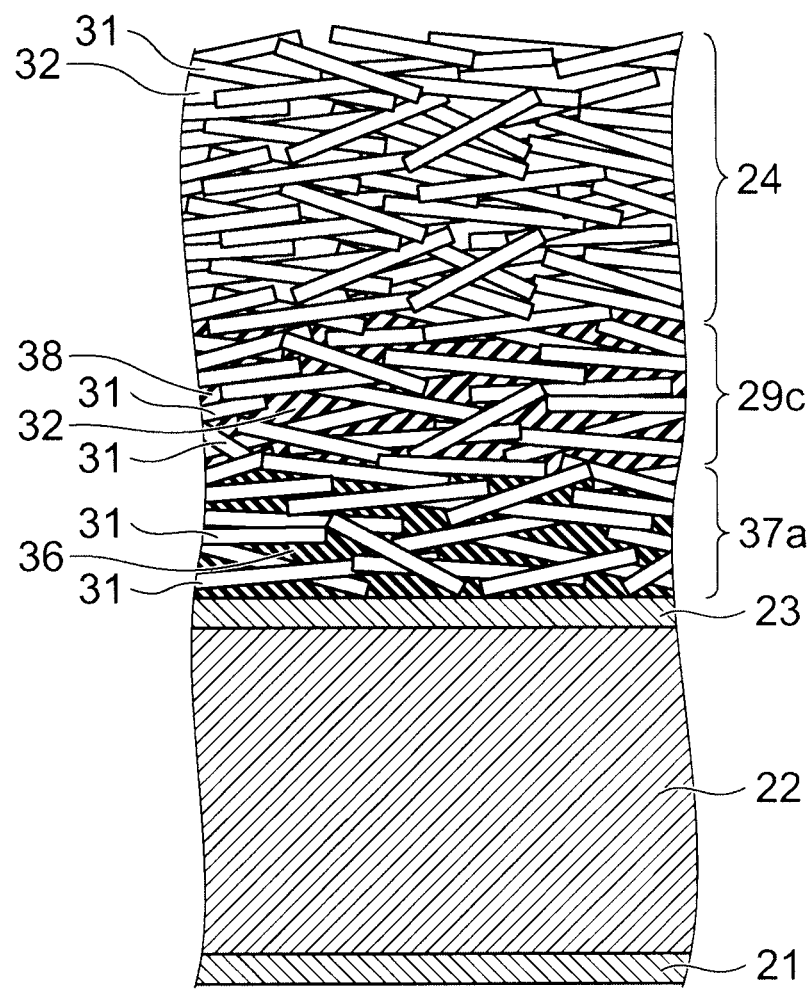

Next, as shown in FIG. 15, a reinforcing material 38, such as a raw material of the aforementioned heat-resistant silicon-based polymer, is applied from above the nanomaterial assembly layer 24. Thus, the reinforcing material 38 penetrates into the gap 32 in the lower part of the portion of the nanomaterial assembly layer 24 above the sacrificial layer 37a. Next, heat treatment is performed to heat-cure the reinforcing material 38. Thus, a reinforcing layer 29c is formed on the sacrificial layer 37a.

Figure 16:
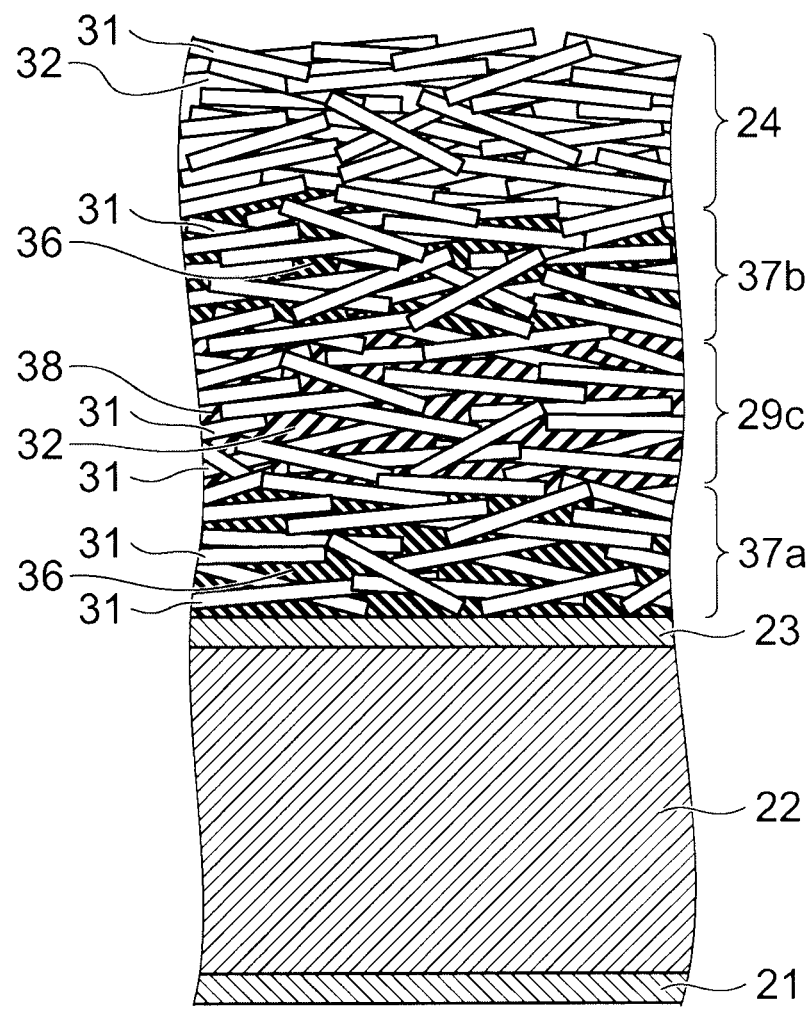

Next, as shown in FIG. 16, in the lower part of the portion of the nanomaterial assembly layer 24 above the reinforcing layer 29c, a sacrificial material 36 is applied and infiltrated into the gap 32. Then, heat treatment is performed to solidify the sacrificial material 36. Thus, a sacrificial layer 37b is formed.

Figure 17:
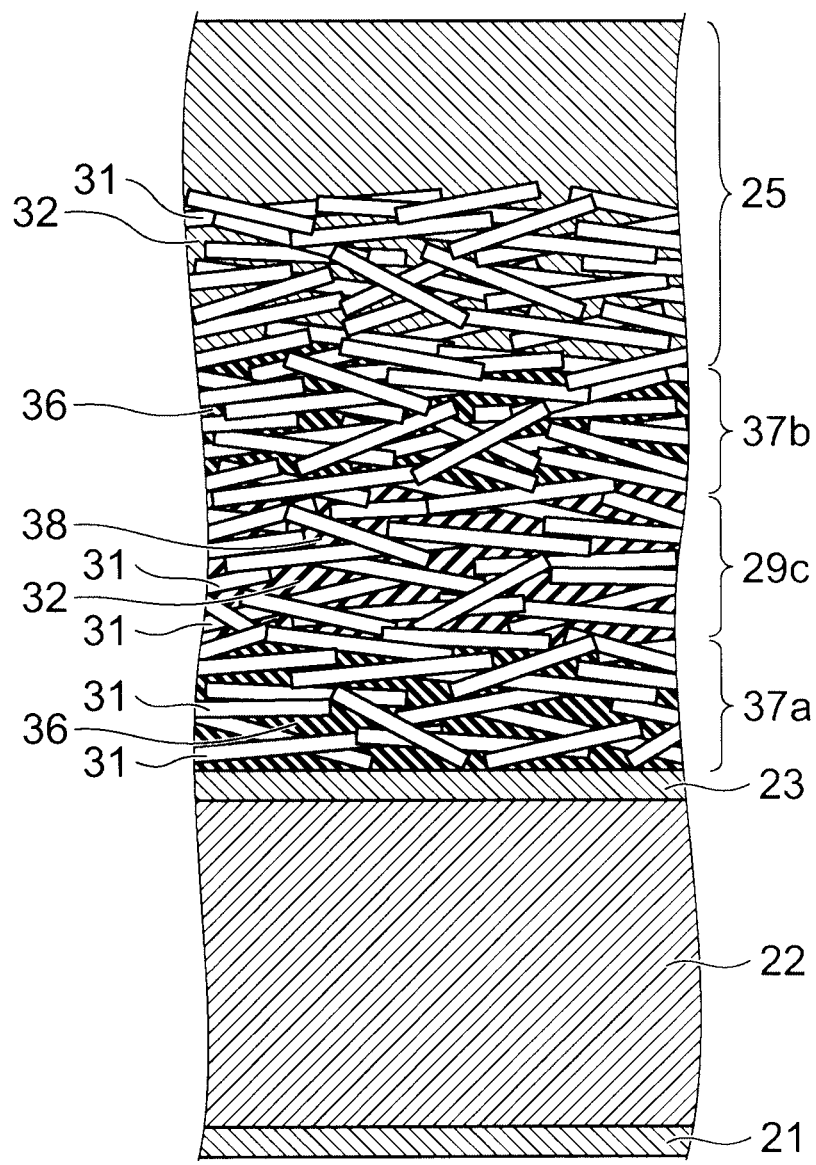

Next, as shown in FIG. 17, an upper electrode layer 25 is formed on the sacrificial layer 37b. In the lower part of the upper electrode layer 25, CNTs 31 are partly buried. Next, pillars 16 are formed by anisotropic etching. Subsequently, the sacrificial material 36 is removed from both the sacrificial layers 37a and 37b. The subsequent process is similar to that of the above first embodiment.

Next, the effect of this embodiment is described.

In this embodiment, by providing a reinforcing layer 29c in the nanomaterial assembly layer 24, the fragile nanomaterial assembly layer 24 can be reinforced. Thus, when a mechanical stress is applied, breakage in the nanomaterial assembly layer can be prevented. The operation and effect of this embodiment other than the foregoing are similar to those of the above first embodiment.

Next, a sixth embodiment is described.

Figure 18:
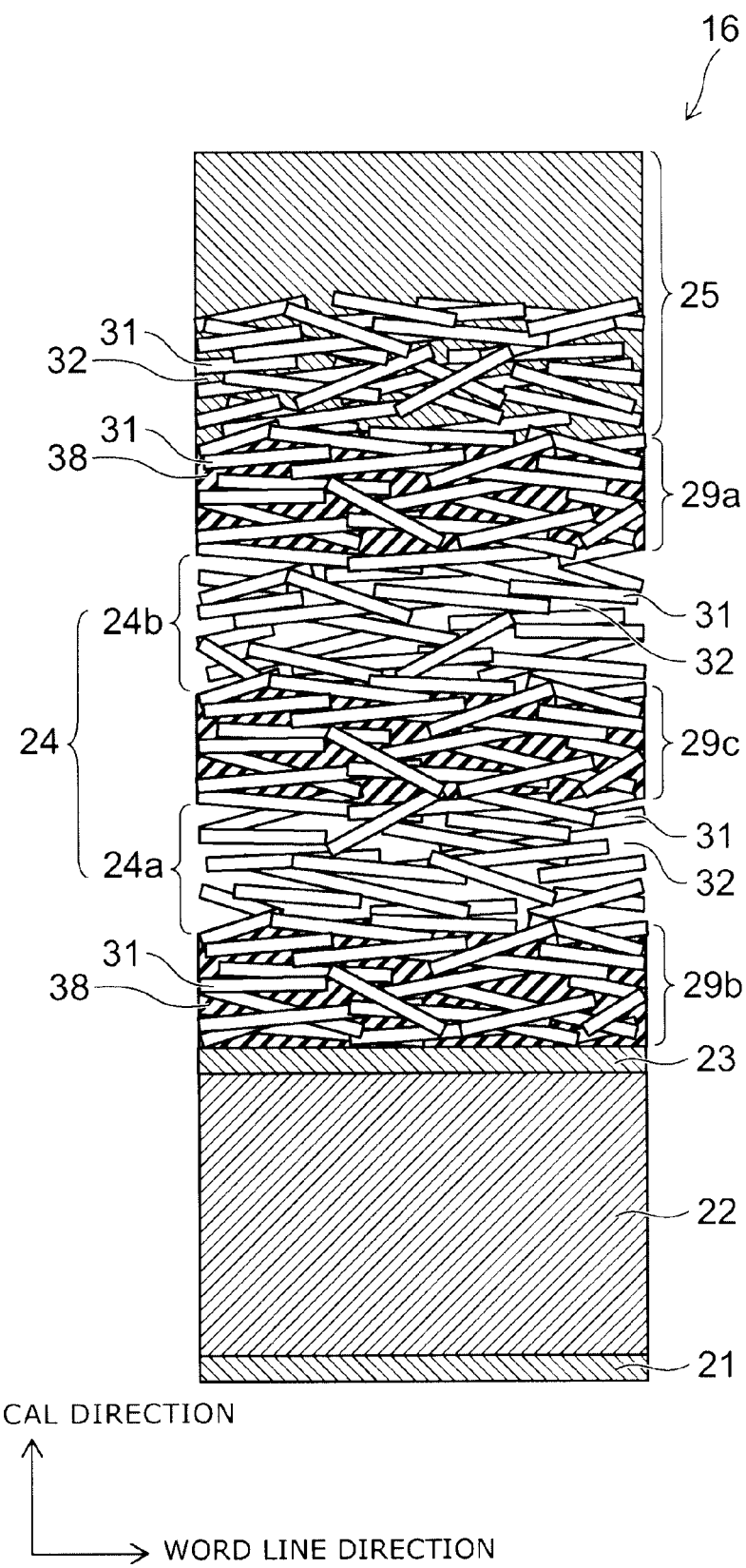
FIG. 18 is a schematic sectional view illustrating one pillar in a sixth embodiment.

FIG. 18 is a schematic sectional view illustrating one pillar in this embodiment.

As shown in FIG. 18, in the nonvolatile memory device according to this embodiment, each pillar 16 includes three reinforcing layers 29a, 29b, and 29c. The reinforcing layer 29a is provided between the nanomaterial assembly layer 24 and the upper electrode layer 25. The reinforcing layer 29b is provided between the lower electrode layer 23 and the nanomaterial assembly layer 24. The reinforcing layer 29c is provided inside the nanomaterial assembly layer 24. The reinforcing layers 29a, 29b, and 29c are formed from e.g. the same material, such as a heat-resistant silicon-based polymer. Alternatively, the reinforcing layers 29a, 29b, and 29c may be formed from different materials.

Such a nonvolatile memory device can be manufactured by combining the above second, fourth, and fifth embodiment. That is, a nanomaterial assembly layer 24 is formed on the lower electrode layer 23. In the nanomaterial assembly layer 24, sequentially from bottom, a reinforcing layer 29b, a sacrificial layer (not shown), a reinforcing layer 29c, a sacrificial layer (not shown), and a reinforcing layer 29a are formed. At this time, part of the nanomaterial assembly layer 24 is left above the reinforcing layer 29a. Next, an upper electrode layer 25 is formed so as to be infiltrated into the remaining portion of the nanomaterial assembly layer 24. Then, processing into pillars 16 is performed. Next, the sacrificial material is removed from the two sacrificial layers.

According to this embodiment, the reinforcing layers 29a, 29b, and 29c are provided. Thus, in forming the lower electrode layer 23 and the upper electrode layer 25 and in the subsequent thermal process, the conductive material forming the lower electrode layer 23 and the conductive material forming the upper electrode layer 25 can be prevented from penetrating into the nanomaterial assembly layer 24. Furthermore, the adhesiveness between the lower electrode layer 23, the nanomaterial assembly layer 24, and the upper electrode layer 25 is improved. Furthermore, the nanomaterial assembly layer 24 can be reinforced. This enhances the reliability of the nonvolatile memory device and facilitates miniaturization of the pillar 16. Thus, the nonvolatile memory device can be further highly integrated. The configuration, manufacturing method, operation, and effect of this embodiment other than the foregoing are similar to those of the above second embodiment. Here, it is also possible to form any two of the reinforcing layers 29a, 29b, and 29c.

Next, a seventh embodiment is described.

Figure 19:
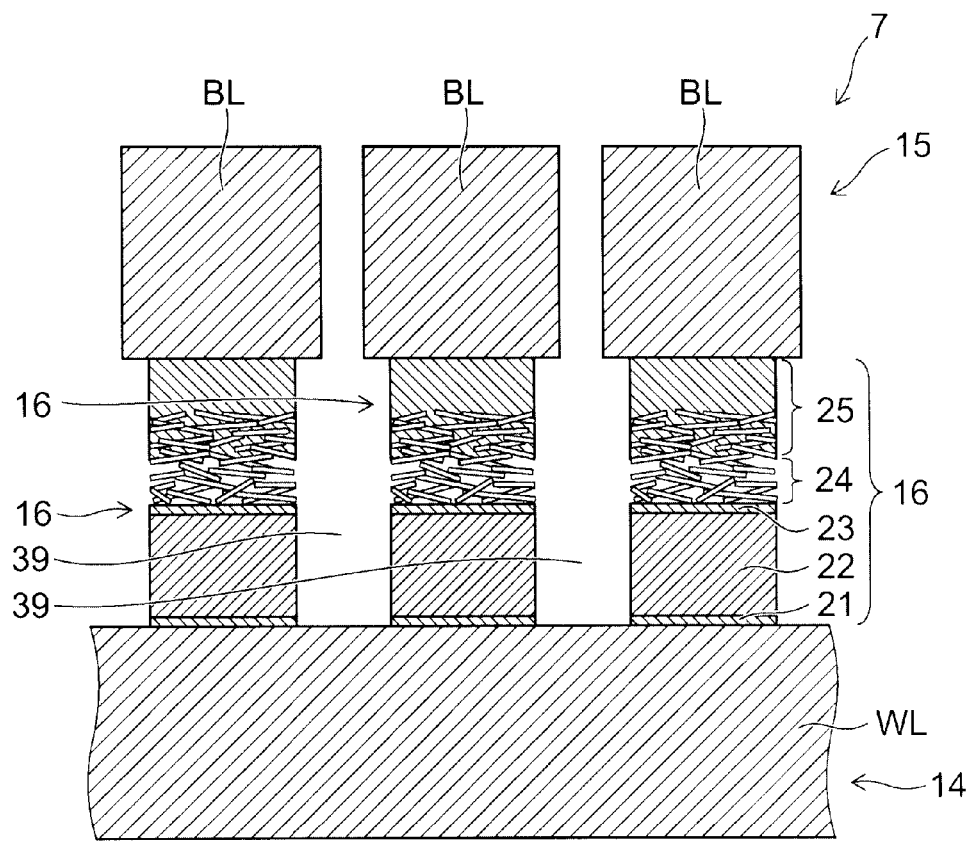
FIG. 19 is a schematic sectional view illustrating the relevant part of a nonvolatile memory device according to a seventh embodiment.

FIG. 19 is a schematic sectional view illustrating the relevant part of a nonvolatile memory device according to this embodiment.

As shown in FIG. 19, the nonvolatile memory device 7 according to this embodiment is different from the nonvolatile memory device according to the above first embodiment in that no interlayer insulating film is provided between the pillars 16, but the pillars 16 are separated from each other by an air layer 39.

Next, a method for manufacturing a nonvolatile memory device according to this embodiment is described.

Figure 20:
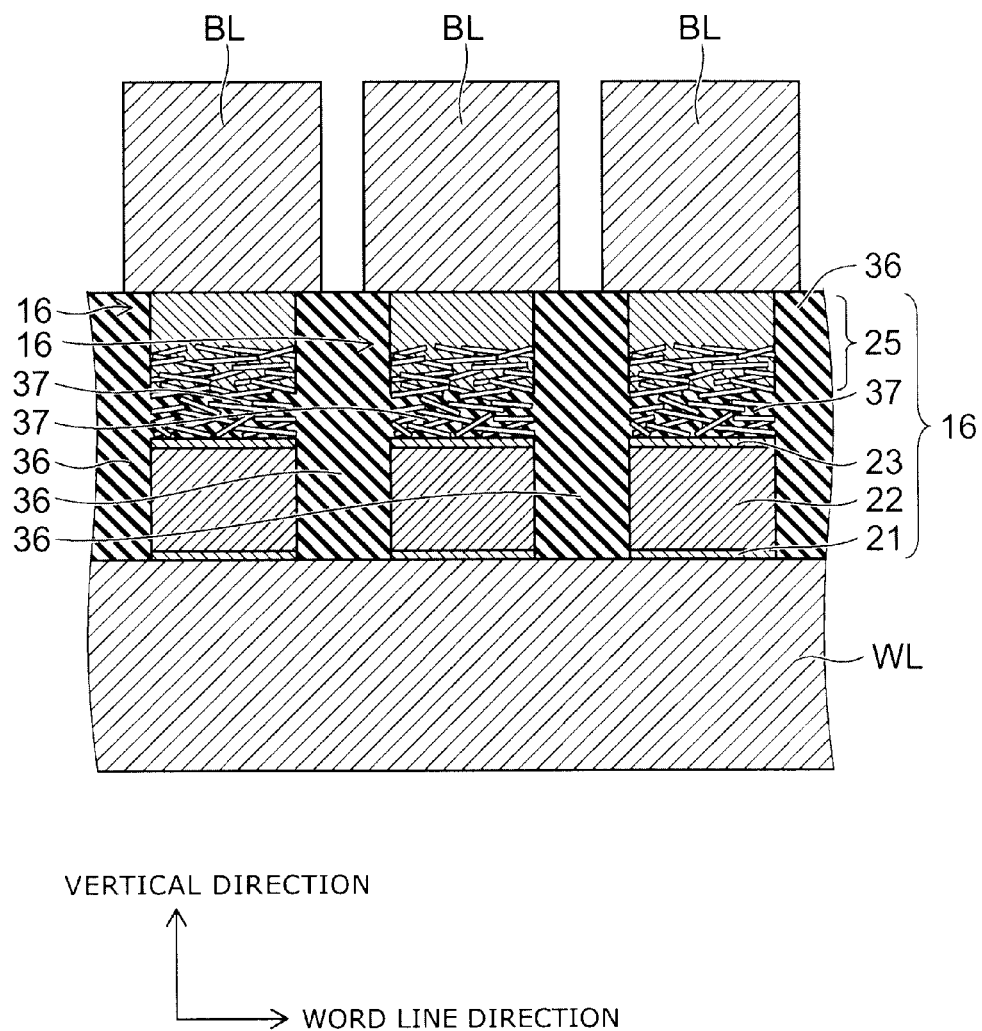
FIG. 20 is a process sectional view schematically illustrating a method for manufacturing the nonvolatile memory device according to the seventh embodiment.

FIG. 20 is a process sectional view schematically illustrating the method for manufacturing a nonvolatile memory device according to this embodiment.

In the manufacturing method according to this embodiment, processes up to the process shown in FIG. 5 are similar to those of the above first embodiment. That is, a sacrificial material 36 is infiltrated into the lower part of the nanomaterial assembly layer 24 to form a sacrificial layer 37. An upper electrode layer 25 is formed thereon. Processing into pillars 16 is performed by RIE.

Next, as shown in FIG. 20, after cleaning, a sacrificial material 36, such as the aforementioned "SiLK", is buried between the pillars 16. Thus, an interlayer insulating film made of the sacrificial material 36 is formed. Next, the upper surface of this interlayer insulating film is planarized by CMP. A second interconnect layer, such as a bit line interconnect layer 15, is formed thereon. Then, a word line interconnect layer 14, a plurality of pillars 16, a bit line interconnect layer 15, and a plurality of pillars 16 are formed repetitively to fabricate a cross-point structure. Subsequently, heat treatment is performed at a temperature of approximately 600° C. to simultaneously vaporize away the sacrificial material 36 included in the insulating layer 37 and the sacrificial material 36 forming the interlayer insulating film. Thus, the nonvolatile memory device 7 (see FIG. 19) according to this embodiment is manufactured.

According to this embodiment, there is no need to form a liner film on the side surface of the pillar 16. Hence, damage to the nanomaterial assembly layer 24 due to formation of the liner film can be avoided. Furthermore, penetration of the material of the liner film into the nanomaterial assembly layer can be prevented. The configuration, manufacturing method, operation, and effect of this embodiment other than the foregoing are similar to those of the above first embodiment.

In the description of the above embodiments, the carbon nanotube (CNT) is taken as an example of the micro conductive body constituting the nanomaterial assembly layer. However, the invention is not limited thereto. The micro conductive body may be e.g. graphene, fullerene, carbon nanoribbon, silicon nanotube, or porous material.

The embodiments described above can achieve a nonvolatile memory device which can be highly integrated, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile memory device comprising:
a lower electrode layer;
a nanomaterial assembly layer provided on the lower electrode layer and including a plurality of micro conductive bodies assembled via a gap; and
an upper electrode layer provided on the nanomaterial assembly layer,
a portion of the micro conductive bodies being buried at least in a lower part of the upper electrode layer;
and further comprising:
a plurality of reinforcing layers in which another portion of the micro conductive bodies is buried in a reinforcing material; and
wherein the reinforcing layers are located between the nanomaterial assembly layer and the upper electrode layer, between the lower electrode layer and the nanomaterial assembly layer, and inside the nanomaterial assembly layer.

2. The device according to claim 1, wherein the micro conductive bodies are carbon nanotubes.

3. The device according to claim 1, further comprising:
a word line interconnect layer including a plurality of word lines extending in a first direction; and
a bit line interconnect layer including a plurality of bit lines extending in a second direction crossing the first direction,
wherein the word line interconnect layer and the bit line interconnect layer are alternately stacked, and
the lower electrode layer, the nanomaterial assembly layer, and the upper electrode layer are stacked between each of the word lines and each of the bit lines to form a pillar.

4. The device according to claim 3, wherein a plurality of pillars are formed, and the pillars are separated from each other by an air layer.

* * * * *